(12) United States Patent
Kho et al.

(10) Patent No.: US 10,619,787 B1
(45) Date of Patent: Apr. 14, 2020

(54) MOUNTING SYSTEMS FOR A VIDEO-CONFERENCING DEVICE, VIDEO CONFERENCING SYSTEMS, AND RELATED METHODS

(71) Applicant: Facebook, Inc., Menlo Park, CA (US)

(72) Inventors: ChuanKeat Kho, San Jose, CA (US); Chenyu Xu, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/116,882

(22) Filed: Aug. 29, 2018

(51) Int. Cl.
*H04N 7/15* (2006.01)
*F16M 11/04* (2006.01)
*H04N 5/655* (2006.01)
*H04N 7/14* (2006.01)
*H05K 5/02* (2006.01)
*F16M 13/02* (2006.01)

(52) U.S. Cl.
CPC .......... *F16M 11/045* (2013.01); *H04N 5/655* (2013.01); *H04N 7/142* (2013.01); *H04N 7/15* (2013.01); *H05K 5/0234* (2013.01); *F16M 13/02* (2013.01)

(58) Field of Classification Search
None
See application file for complete search history.

(56) References Cited

U.S. PATENT DOCUMENTS

| | | | | |
|---|---|---|---|---|
| 5,615,854 A * | 4/1997 | Nomura | ................. | F16M 11/10 248/205.3 |
| 5,900,907 A * | 5/1999 | Malloy | ................. | H04N 7/142 348/14.1 |
| 6,300,979 B1 * | 10/2001 | Parkinson | ............... | F16M 11/08 248/187.1 |
| 6,600,827 B2 * | 7/2003 | Lu | .......................... | G06F 1/1605 248/316.4 |
| 6,667,877 B2 * | 12/2003 | Duquette | .............. | G06F 1/1607 248/917 |
| 7,034,902 B2 * | 4/2006 | Tajima | .................. | G06F 1/1601 248/221.11 |
| 7,554,800 B2 * | 6/2009 | Bragg | ................... | G06F 1/1632 348/373 |
| 7,878,476 B2 * | 2/2011 | Carson | ................ | B60R 11/0235 211/26 |
| 7,907,164 B2 * | 3/2011 | Kenoyer | ........... | H04L 29/06027 348/14.01 |
| 7,972,006 B2 * | 7/2011 | Giraldo | .................. | G06Q 10/00 348/14.1 |
| 8,238,584 B2 * | 8/2012 | Saito | ...................... | H04R 1/403 381/122 |
| 8,270,651 B2 * | 9/2012 | McCarty | .................. | H04N 5/64 181/150 |
| 8,317,146 B2 * | 11/2012 | Jung | ...................... | G06F 1/1601 248/125.7 |
| 8,350,889 B1 * | 1/2013 | Shammoh | .............. | H04N 7/142 348/14.01 |

(Continued)

*Primary Examiner* — Xanthia C Cunningham
(74) *Attorney, Agent, or Firm* — FisherBroyles, LLP

(57) ABSTRACT

The disclosed mounting system for a video-conferencing device may include a cradle configured to support a video-conferencing device, a top bracket configured to couple to a chassis of the video-conferencing device and configured to removably couple to an upper portion of the cradle, and a bottom bracket configured to couple to the chassis and configured to removably couple to a lower portion of the cradle. Various other methods and systems are also disclosed.

20 Claims, 9 Drawing Sheets

(56) References Cited

U.S. PATENT DOCUMENTS

| | | | | |
|---|---|---|---|---|
| 8,462,103 B1* | 6/2013 | Moscovitch | | B60R 11/02 345/1.1 |
| 8,582,284 B2* | 11/2013 | Toles | | F16M 13/02 248/220.21 |
| 8,775,710 B1* | 7/2014 | Miller | | G06F 1/1626 361/679.17 |
| 8,972,617 B2* | 3/2015 | Hirschman | | G06F 3/0219 463/37 |
| 9,256,254 B2* | 2/2016 | Appleton | | F16M 13/02 |
| 9,441,782 B2* | 9/2016 | Funk | | F16M 13/02 |
| 9,644,787 B2* | 5/2017 | McArdle | | G06F 1/1601 |
| 9,913,388 B1* | 3/2018 | McHatet | | H05K 5/0204 |
| 9,955,598 B1* | 4/2018 | Wen | | H05K 7/1428 |
| 10,185,686 B2* | 1/2019 | Nguyen | | G06F 13/409 |
| 2004/0041902 A1* | 3/2004 | Washington | | H04N 7/142 348/14.01 |
| 2005/0231587 A1* | 10/2005 | Root | | H04N 7/142 348/14.07 |
| 2007/0046837 A1* | 3/2007 | Elberbaum | | F16M 13/02 348/739 |
| 2008/0088696 A1* | 4/2008 | Giraldo | | H04N 7/144 348/14.08 |
| 2009/0090825 A1* | 4/2009 | Jung | | G06F 1/1601 248/205.1 |
| 2009/0257201 A1* | 10/2009 | Burge | | F16M 11/105 361/729 |
| 2012/0037771 A1* | 2/2012 | Kitchen | | G06F 1/1632 248/223.41 |
| 2012/0105573 A1* | 5/2012 | Apostolopoulos | | H04N 7/142 348/14.08 |
| 2012/0127259 A1* | 5/2012 | Mackie | | H04N 7/142 348/14.07 |
| 2012/0134519 A1* | 5/2012 | Caldes | | H04R 1/02 381/306 |
| 2013/0321715 A1* | 12/2013 | Millson | | F16M 11/048 348/739 |
| 2015/0138304 A1* | 5/2015 | McArdell | | A47B 21/00 348/14.07 |
| 2015/0305518 A1* | 10/2015 | Galant | | F16M 11/041 248/551 |
| 2015/0365628 A1* | 12/2015 | Ben-Bassat | | G06F 3/011 348/14.1 |
| 2016/0277708 A1* | 9/2016 | Rintel | | H04N 7/142 |
| 2017/0223312 A1* | 8/2017 | McNelley | | H04N 7/15 |
| 2018/0063481 A1* | 3/2018 | Yu | | H04N 7/15 |
| 2018/0309957 A1* | 10/2018 | Baldwin | | H04N 7/142 |
| 2018/0373335 A1* | 12/2018 | Seiler | | H04N 21/4131 |
| 2019/0034075 A1* | 1/2019 | Smochko | | G06F 3/04883 |

* cited by examiner

MOUNTING SYSTEMS FOR A VIDEO-CONFERENCING DEVICE, VIDEO CONFERENCING SYSTEMS, AND RELATED METHODS

BACKGROUND

Video-conferencing systems are used in business and other settings to connect people who are in different locations for meetings, collaboration, and other communications. Video-conferencing systems typically include a display screen and a video-conferencing processing device, which may process and transmit incoming and outgoing video and audio signals to enable participants to communicate with each other. Such processing devices may be positioned behind the associated display screens to hide them from view during normal operation.

Display screens for video-conferencing may be relatively heavy, and some display screens and processing devices may be wall-mounted at or above waist-height. Thus, significant physical effort and/or more than one person may be required for accessing video-conferencing processing devices for installation, maintenance, adjustments, or removal. In addition, installation or removal of the processing devices may require the use of tools to secure the devices to a wall or other supporting structure, and may be performed in tight spaces (e.g., behind the display screens).

SUMMARY

As will be described in greater detail below, the instant disclosure describes mounting systems and video-conferencing systems that include a cradle, a top bracket configured to removably couple to the cradle, and a bottom bracket configured to removably couple to the cradle. Related methods of mounting video-conferencing devices are also disclosed. Video-conferencing devices may be mounted using such systems and methods in a secure and easy manner.

In some examples, the present disclosure includes mounting systems for a video-conferencing device. Such mounting systems may include a cradle configured to support a video-conferencing device, a top bracket configured to couple to a chassis of the video-conferencing device and configured to removably couple to an upper portion of the cradle, and a bottom bracket configured to couple to the chassis of the video-conferencing device and configured to removably couple to a lower portion of the cradle.

In some examples, the cradle may include an elongated protrusion and a surface of the top bracket may at least partially define a gap shaped and oriented to receive the elongated protrusion. The elongated protrusion may extend upward when the system is assembled. The bottom bracket may include a first hole and the cradle may include a second hole located to align with the first hole when the system is assembled. The system may also include a fastener to secure the bottom bracket to the cradle via the first and second holes. The fastener may include a thumb screw, a twist lock fastener, or a wing nut, for example. The bottom bracket may include at least one recess, and the cradle may include at least one corresponding protrusion positioned to seat at least partially within the at least one recess when the system is assembled. The cradle may include a plurality of holes positioned for engagement with a plurality of different mounting structures. The different mounting structures may include at least two of: a wall, a Video Electronics Standards Association (VESA) mount, a wall mount, a horizontal monitor screen mount, or a sliding-rail mount. Each of the top bracket and the bottom bracket may include at least one hole for coupling to the chassis of the video-conferencing device.

In some examples, video-conferencing systems are disclosed that may include a video-conferencing device, a cradle, a top bracket, and a bottom bracket. The video-conferencing device may include a chassis and at least video and auto outputs and video and audio inputs. The cradle may be configured to support the video-conferencing device. The top bracket may be coupled to the chassis and may be configured to removably couple to an upper portion of the cradle. The bottom bracket may be coupled to the chassis and may be configured to removably couple to a lower portion of the cradle.

In some embodiments, the top bracket and the bottom bracket may each be coupled to the chassis via thumb screws, twist lock fasteners, or wing nuts. The chassis of the video-conferencing device may include holes located for coupling the video-conferencing device to the top bracket and to the bottom bracket. The cradle may include an elongated protrusion and the top bracket may include a surface that at least partially defines a gap shaped and sized for receiving at least a portion of the elongated protrusion when the video-conferencing device is mounted to the cradle. The chassis of the video-conferencing device may include a surface that also at least partially defines the gap. The bottom bracket may include an attachment element, and the cradle may include a complementary engagement feature for removably coupling the bottom bracket to the cradle. Each of the top bracket and the bottom bracket may have an L-shaped cross section.

In some examples, the present disclosure includes methods of mounting a video-conferencing device. In accordance with such methods, a top bracket may be coupled to a chassis of a video-conferencing device. A bottom bracket may also be coupled to the chassis. The top bracket may be removably coupled to an upper portion of a cradle that is configured to support the video-conferencing device. The bottom bracket may be removably coupled to a lower portion of the cradle.

In some embodiments, removably coupling the top bracket to the upper portion of the cradle may include positioning an elongated protrusion of the cradle within a gap at least partially defined by a surface of the top bracket. Removably coupling the bottom bracket to the lower portion of the cradle may include at least one of: positioning at least one protrusion of the bottom bracket at least partially within at least one corresponding recess in the cradle, or securing the bottom bracket to the cradle with a thumb screw, a twist lock fastener, or a wing nut. The methods may also include attaching the cradle to a mounting structure that is at least one of: a wall, a VESA mount, a wall mount, a horizontal monitor screen mount, or a sliding-rail mount.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the instant disclosure.

Figure 1:
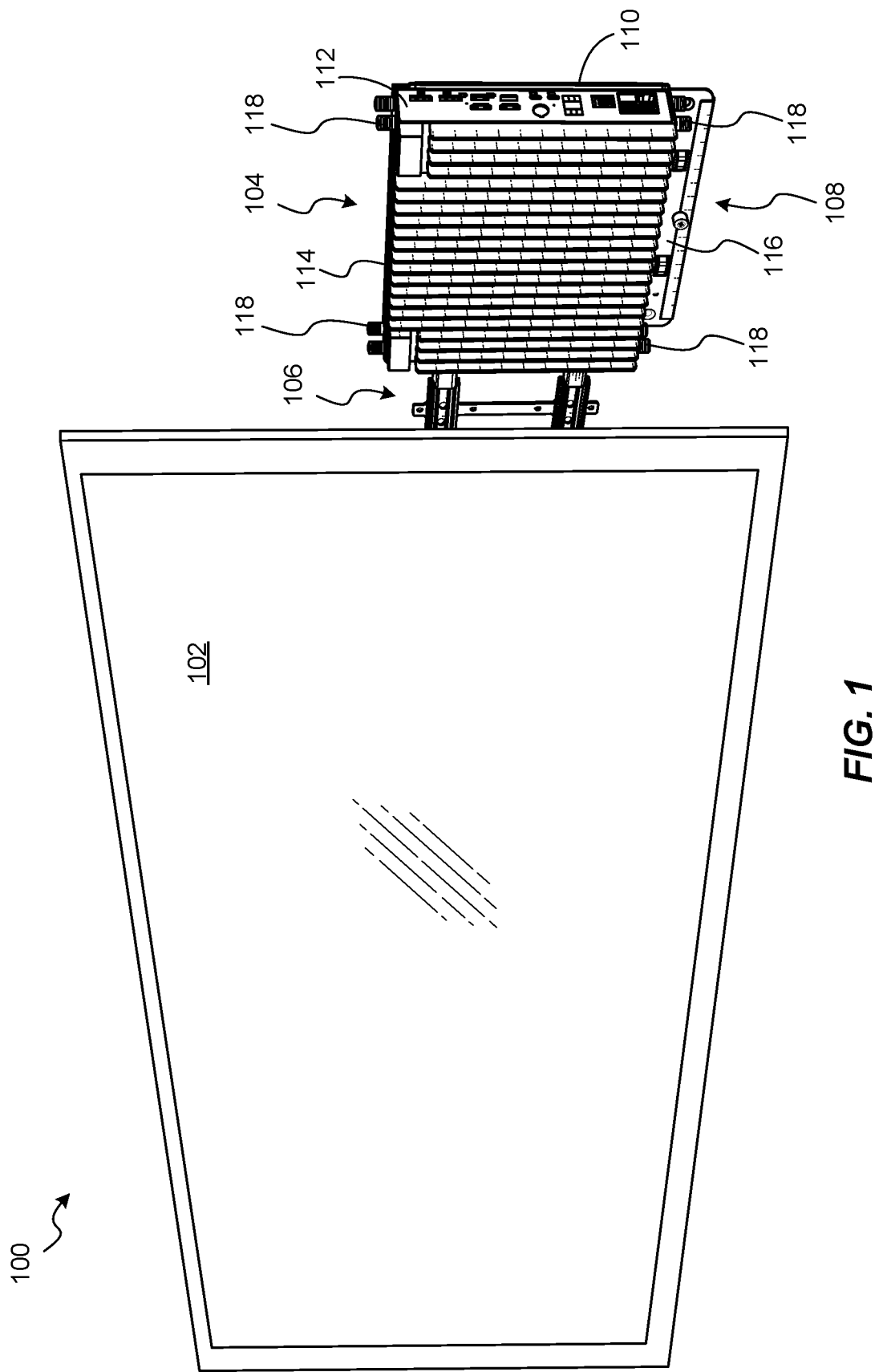
FIG. 1 is a perspective view of a video-conferencing system according to embodiments of this disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure is generally directed to mounting systems for video-conferencing devices, video-conferencing systems, and methods of mounting video-conferencing devices. As will be explained in greater detail below, embodiments of this disclosure may include mounting systems that include a cradle for supporting a video-conferencing device, a top bracket, and a bottom bracket. The top bracket may be configured to couple to a chassis of the video-conferencing device and may be configured to removably couple to an upper portion of the cradle. The bottom bracket may be configured to couple to the chassis of the video-conferencing device and may be configured to removably couple to a lower portion of the cradle. Embodiments of the disclosure may facilitate installation, storage, and removal of video-conferencing devices, such as behind video-conferencing displays. For example, example mounting systems according to this disclosure may be capable of securely supporting a video-conferencing device while enabling easy manual removal without the use of tools.

The following will provide, with reference to FIG. 1, detailed descriptions of a video-conferencing system. Detailed descriptions of example video-conferencing devices and mounting systems will be provided with reference to FIGS. 2-8. The discussion related to FIG. 9 will provide detailed descriptions of example methods of mounting video-conferencing devices.

FIG. 1 is a perspective view of a video-conferencing system 100 according to embodiments of this disclosure. The video-conferencing system 100 may include a video-conferencing display 102 and a video-conferencing device 104. The video-conferencing device 104 may be mounted to be positioned at least partially (i.e., partially or fully) behind the video-conferencing display 102 when in use. In some examples, the video-conferencing device 104 may be mounted on a rail assembly 106, such as to slide between a maintenance or installation position at least partially exposed from behind the video-conferencing display 102 (as shown in FIG. 1) and an operational position behind the video-conferencing display 102. As explained below, however, the video-conferencing system 100 may be configured for additional and different mounting options.

The video-conferencing display 102 may be, for example, an electronic display (e.g., LED display, LCD display, plasma display, etc.) or a projector screen. In some examples, the video-conferencing display 102 may be positioned in a conference room for use in video-conferencing with remote systems and users.

The video-conferencing device 104 may be supported (e.g., on the rail assembly 106) by a mounting system 108. The mounting system 108 may include a cradle 110 that may support the video-conferencing device 104 and may couple the video-conferencing device 104 to the rail assembly 106 or to another mounting structure (e.g. directly to a wall, to a Video Electronics Standards Association (VESA) mount, to a wall mount, to a horizontal monitor screen mount, etc.). For example, a chassis 112 of the video-conferencing device 104 may be coupled (e.g., removably coupled) to the cradle 110 via a top bracket 114 and a bottom bracket 116. Each of the top bracket 114 and the bottom bracket 116 may be secured to the chassis 112, such as with thumb screws 118. The thumb screws 118 or other suitable fasteners may, for example, extend into corresponding holes formed in the chassis 112. The cradle 110 may be secured to the rail assembly 106, which may in turn be secured to a wall for supporting the video-conferencing device 104. Further explanations of embodiments of the video-conferencing device 104 and example mounting systems for the video-conferencing device 104 are provided below, such as with reference to FIGS. 2-8.

Figure 2:
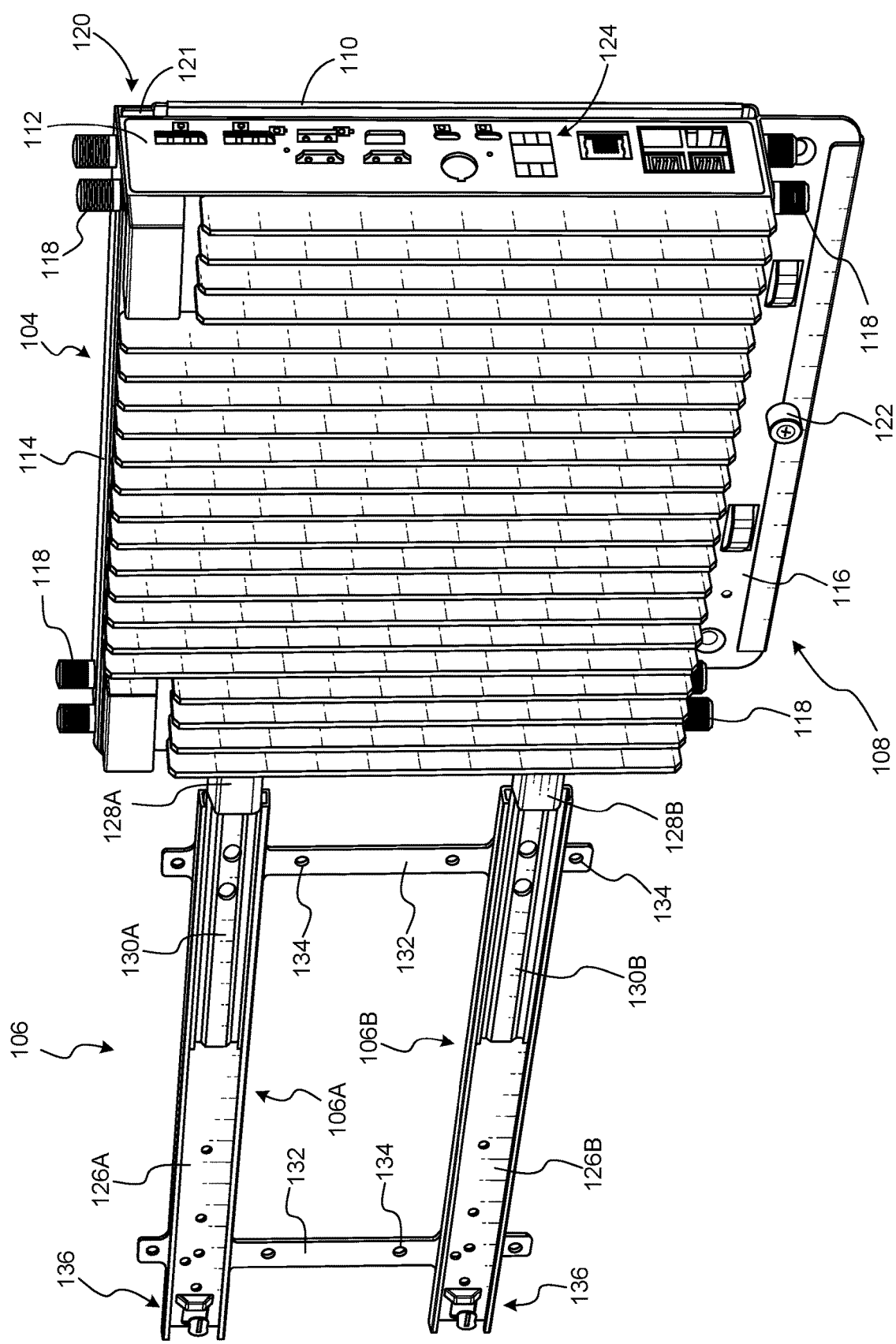
FIG. 2 is a front perspective view of a video-conferencing device and an example mounting system of the video-conferencing system of FIG. 1.

FIG. 2 illustrates a detailed front perspective view of the video-conferencing device 104 and the mounting system 108 of the video-conferencing system 100 of FIG. 1. As shown in FIG. 2 and as noted above, the top bracket 114 may be secured to an upper portion of the chassis 112 of the video-conferencing device 104 with, for example, thumb screws 118. The bottom bracket 116 may be secured to a lower portion of the chassis 112 with thumb screws 118. Thus, the chassis 112 may include holes (e.g., threaded holes) in locations configured for coupling the brackets 114, 116 thereto via the thumb screws 118.

The cradle 110 may be a generally plate-like member with features for removably coupling top bracket 114 and the bottom bracket 116 thereto, and for coupling to a mounting structure (e.g., the rail assembly 106). For example, as shown in FIG. 2, a portion of the top bracket 114 may be seated over an upper edge 120 of the cradle 110 when the video-conferencing device 104 is assembled with the mounting system 108. For example, an elongated protrusion 121 may extend along the upper edge 120. A portion of the bottom bracket 116 may abut against a lower portion of the cradle 110 and may be removably coupled to the cradle 110 with a fastener, such as a mounting thumb screw 122, a twist lock fastener, or a wing nut, for example. The cradle 110 may include a complementary feature, such as a hole (e.g., a threaded hole) and/or a nut for engagement with the mounting thumb screw 122 or another suitable fastener.

The video-conferencing device 104 may include a number of inputs and outputs 124, such as audio inputs and/or outputs and video inputs and/or outputs. By way of example and not limitation, the inputs and outputs 124 may include one or more of: power inputs, USB inputs and/or outputs, HDMI inputs and/or outputs, analog inputs and/or outputs, telephone cable inputs and/or outputs, ethernet cable inputs and/or outputs, coaxial cable inputs and/or outputs, wireless inputs and/or outputs, audio jack inputs and/or outputs, fiber optic cable inputs and/or outputs, or Bluetooth inputs and/or outputs, etc. The video-conferencing device 104 may also include (e.g., internally) one or more electronic devices for processing and/or transmitting incoming data for display on the video-conferencing display 102 and/or for providing a signal to corresponding audio devices (e.g., speakers). For example, the video-conferencing device 104 may include one or more of a video card, an audio card, a hard drive, a solid-state drive, a memory device, an application-specific integrated circuit (ASIC) device, a motherboard, a central processing unit, etc.

The rail assembly 106 may include, for example, an upper sliding rail 106A and a lower sliding rail 106B. The upper sliding rail 106A may include, for example, an upper base rail element 126A, an upper sliding rail element 128A, and an upper intermediate rail element 130A that may be slidably coupled to both the upper base rail element 126A and the upper sliding rail element 128A. In this manner, the upper sliding rail element 128A may be slidably coupled to the upper base rail element 126A via the upper intermediate rail element 130A. In additional embodiments, the upper sliding rail element 128A may be directly slidably coupled to the upper base rail element 126A and the upper intermediate rail element 130A may be absent. Similarly, the lower sliding rail 106B may include, for example, a lower base rail element 126B, a lower sliding rail element 128B, and a lower intermediate rail element 130B that may be slidably coupled to both the lower base rail element 126B and the lower sliding rail element 128B. In this manner, the lower sliding rail element 128B may be slidably coupled to the lower base rail element 126B via the lower intermediate rail element 130B. In additional embodiments, the lower sliding rail element 128B may be directly slidably coupled to the lower base rail element 126B and the lower intermediate rail element 130B may be absent.

The rail assembly 106 may also include one or more vertical support elements 132 extending between and coupled to the upper base rail element 126A and the lower base rail element 126B. For example, the vertical support elements 132 may maintain a parallel relationship between the upper and lower base rail elements 126A, 126B for improved extension and retraction of the rail assembly 106. Each of the vertical support elements 132 may also include one or more mounting holes 134, such as for securing the rail assembly 106 to a wall or other support structure.

In some embodiments, one or more locking mechanisms 136 may be positioned on each of base rail elements 126A, 126B. The locking mechanisms 136 may be configured to maintain the rail assembly 106 in a retracted, closed state in the absence of a sufficient applied opening force. The locking mechanisms 136 may, in some embodiments, be push-to-lock mechanisms. For example, the locking mechanisms 136 may engage with the respective upper and lower sliding rail elements 128A, 128B when the rail assembly 106 is pushed into a retracted, closed position. When a sufficient opening force is applied to the sliding rail elements 128A, 128B (e.g., by pushing or pulling on the video-conferencing device 104 away from the locking mechanisms 136), the locking mechanisms 136 may disengage with the sliding rail elements 128A, 128B to enable the rail assembly 106 to move toward an extended, open position (e.g., the position shown in FIG. 2).

Figure 3:
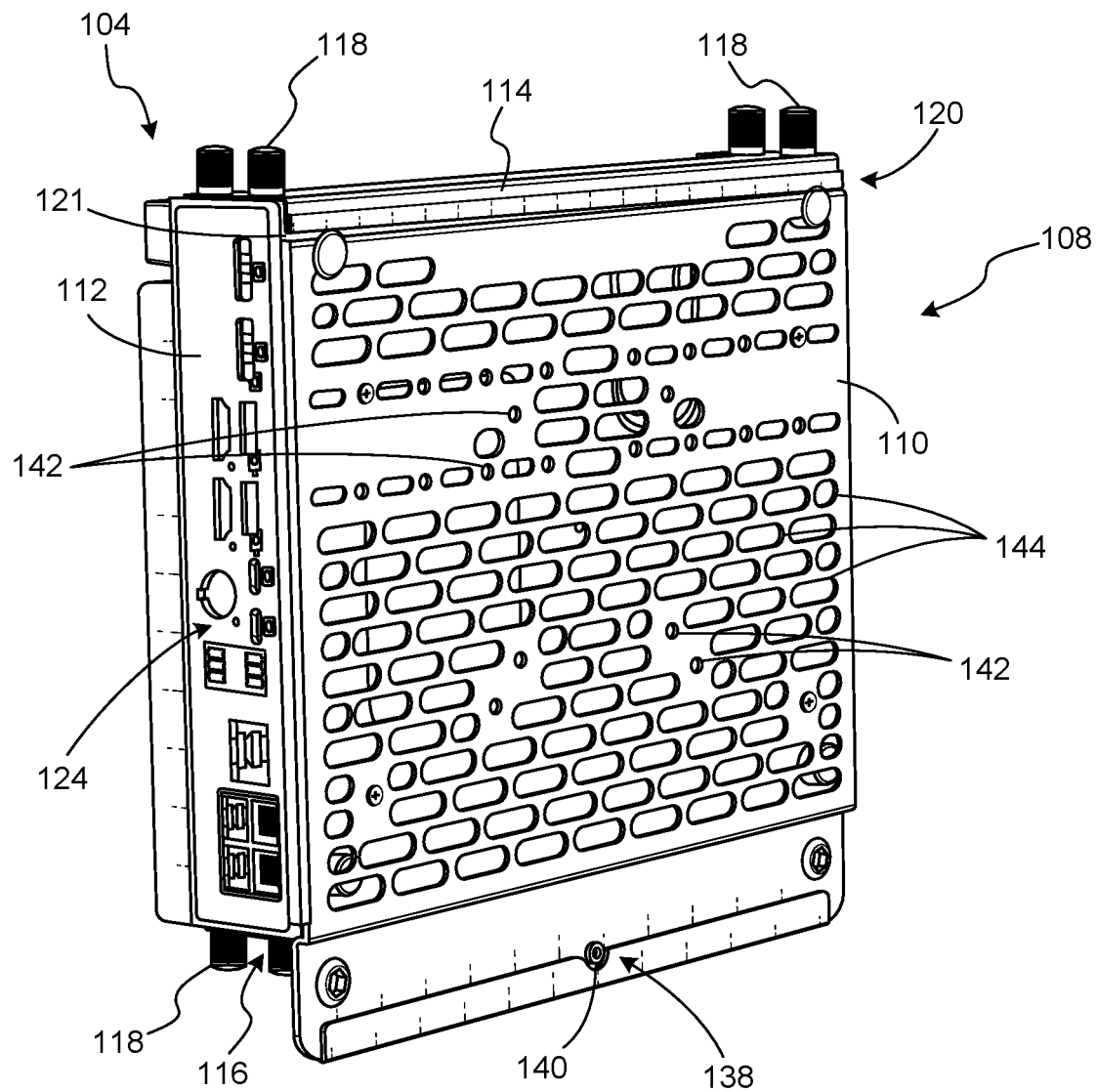
FIG. 3 is a rear perspective view of the video-conferencing device and mounting system of FIGS. 1 and 2, with a rail assembly removed for clarity.

FIG. 3 shows a rear perspective view of the video-conferencing device 104 and mounting system 108 of FIGS. 1 and 2, with the rail assembly 106 removed for clarity. As discussed above, the video-conferencing device 104 may include a chassis 112 and video and audio inputs and/or outputs 124. The top bracket 114 and the bottom bracket 116 may be secured to the chassis 112 with thumb screws 118, for example. A portion of the top bracket 114 may extend downward over the elongated protrusion 121 at the upper edge 120 of the cradle 110 when the video-conferencing device 104 is assembled with the cradle 110. A lower portion of the cradle 110 may include a securing hole 138 positioned to receive a fastener (e.g., the mounting thumb screw 122 (FIG. 2)) for removably coupling the bottom bracket 116 to the cradle 110. In some examples, a nut 140 may be positioned around the securing hole 138 so the mounting thumb screw 122 may engage with the nut 140. In additional examples, the securing hole 138 may be defined by a threaded surface for engaging with the mounting thumb screw 122 and the nut 140 may be absent.

The cradle 110 may be a generally planar element that is configured to support the video-conferencing device 104 and to be coupled to a wall or other support structure. The cradle 110 may include mounting holes 142 in various different positions for engaging with various different mounting structures, such as commercially available mounting structures. For example, mounting holes 142 may be positioned to engage with a wall, a VESA mount, a wall mount, a horizontal screen mount, and/or a sliding-rail mount. In addition, the cradle 110 may include ventilation holes 144 to facilitate cooling of the video-conferencing device during operation. The cradle 110 may be formed of a variety of different materials. For example, the cradle 110 may be formed of a metal, a polymer, or a fiber-matrix composite material.

Figure 4:
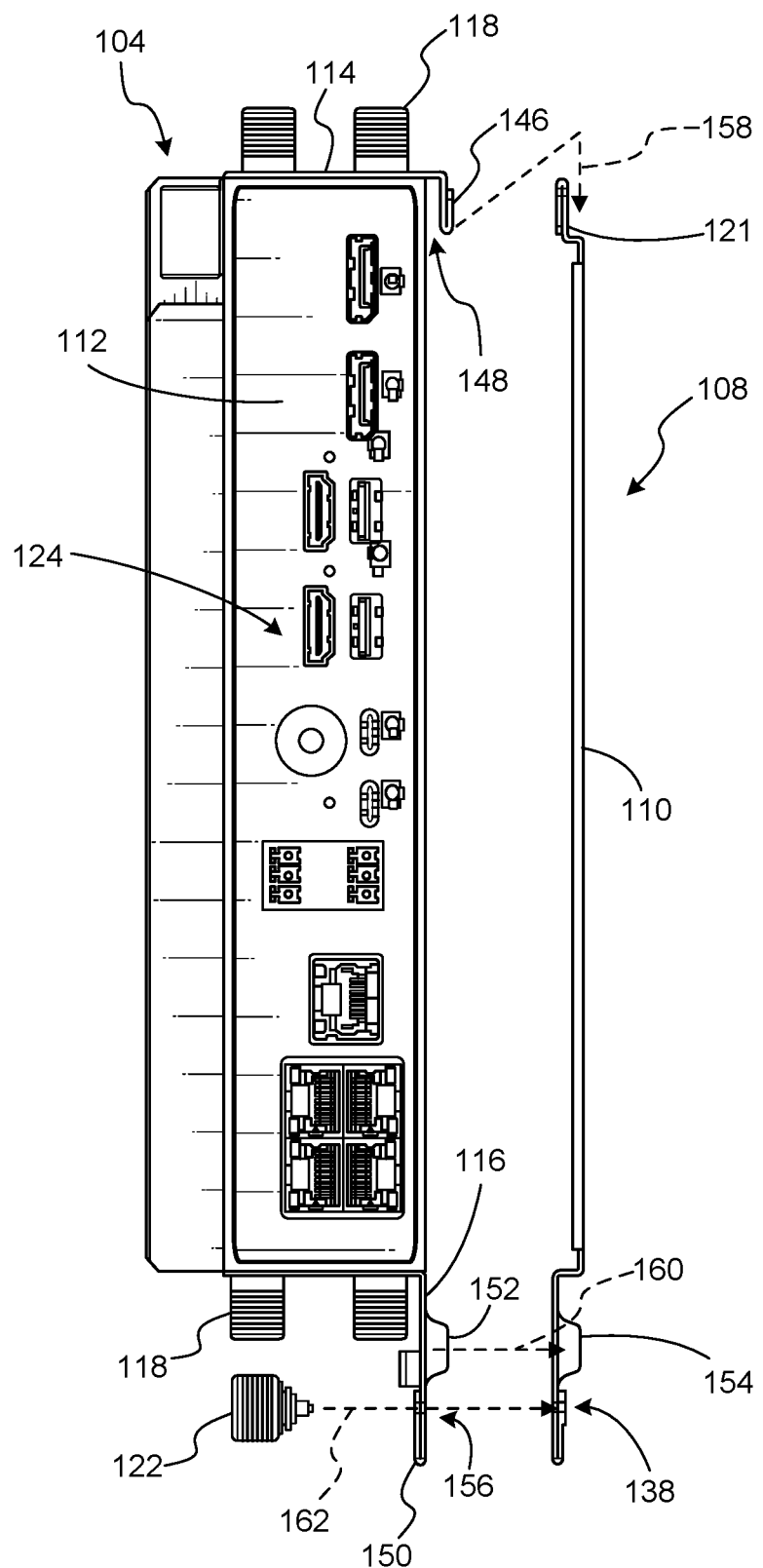
FIG. 4 is an exploded side view of the video-conferencing device and mounting system of FIG. 3.
Figure 5:
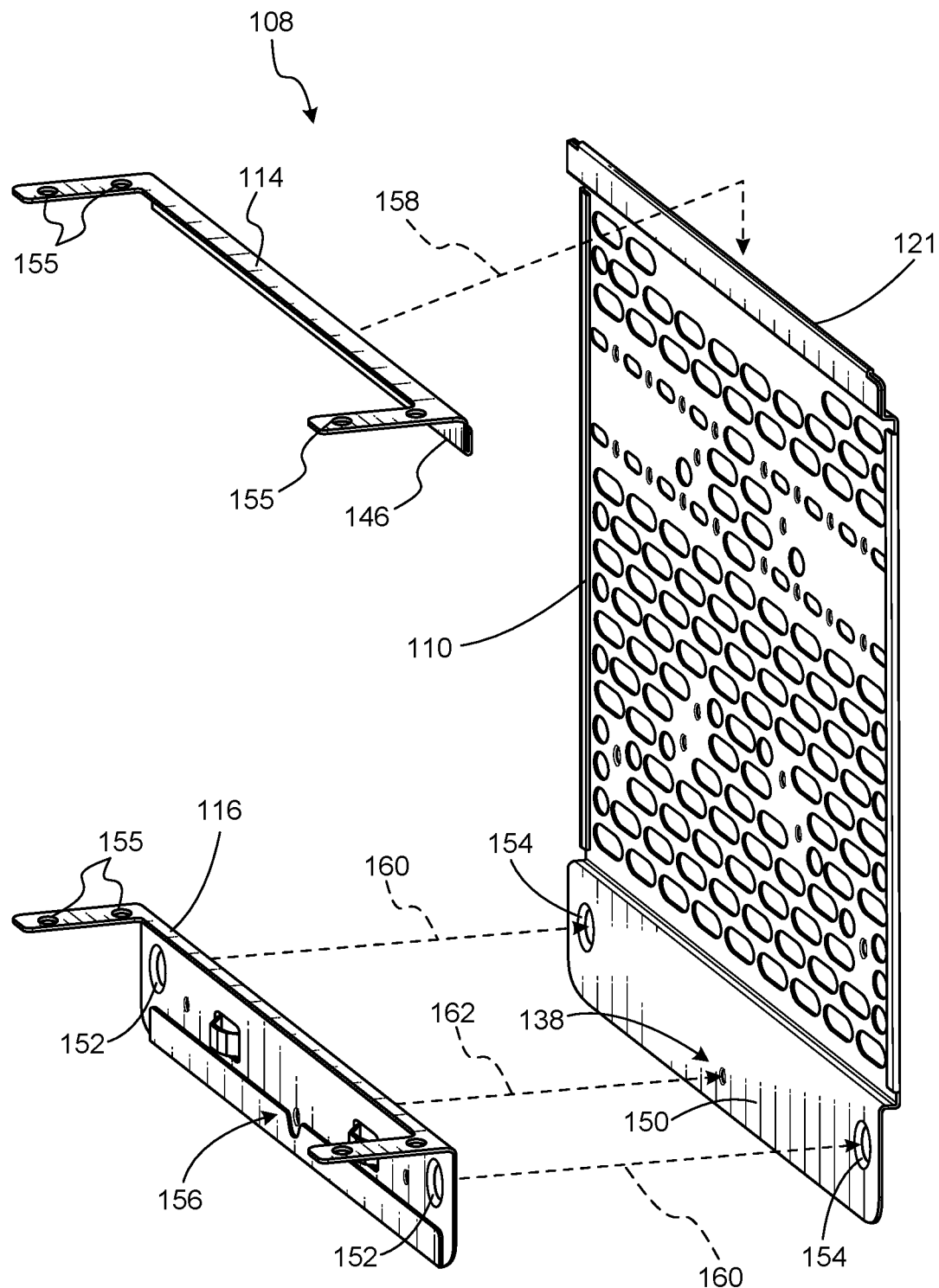
FIG. 5 is an exploded perspective view of a cradle and brackets of the mounting system of FIG. 3.

FIG. 4 is an exploded side view of the video-conferencing device 104 and mounting system 108 of FIG. 3, illustrating a manner in which the video-conferencing device 104 may be mounted to the cradle 110. FIG. 5 is an exploded perspective view of certain elements of the mounting system 108, with the video-conferencing device 104 removed for clarity.

Referring to FIGS. 4 and 5, the top bracket 114 may have an L-shaped cross section, with a portion of the top bracket 114 abutting against a top surface of the video-conferencing device 104 and a downward lip 146 extending along a portion of a back surface of the video-conferencing device 104. As shown in FIG. 4, a surface of the top bracket 114 (i.e., on an inner side of the downward lip 146) and the back surface of the video-conferencing device 104 may be positioned relative to one another to define a gap 148 that may be shaped and oriented to receive the elongated protrusion 121 of the cradle 110.

The bottom bracket 116 may have an L-shaped cross section, with a portion of the bottom bracket 116 abutting against a bottom surface of the video-conferencing device 104 and a downward extension 150. The downward extension 150 may include at least one protrusion 152 extending in a backward direction relative to the video-conferencing device 104 (e.g., to the right from the perspective of FIG. 4). The cradle 110 may include at least one complementary recess 154 shaped and sized to receive at least a portion of the protrusion 152. The protrusion 152 and recess 154 may be present to facilitate proper alignment between the bottom bracket 116 and the cradle 110, for example. The protrusion 152 may be an attachment element and the recess 154 may be a complementary engagement feature. In additional embodiments, other attachment elements (e.g., screws, holes, nuts, pins, clips, etc.) and complementary engagement features (e.g., screws, holes, nuts, pins, clips, etc.) may be used in addition to or in place of the protrusion 152 and the recess 154.

As shown in FIG. 5, the top bracket 114 and the bottom bracket 116 may, in some examples, each include one or more holes 155 for coupling the brackets 114, 116 to the chassis 112 of the video-conferencing device 104.

As noted above, the cradle 110 may include a securing hole 138. The bottom bracket 116 may include another hole 156 that is positioned to align with the securing hole 138. The securing hole 138 and the other hole 156 may be configured to receive the mounting thumb screw 122 for removably coupling the bottom bracket 116 to the cradle 110.

Referring to FIGS. 4 and 5, to assemble the video-conferencing device 104 to the cradle 110, the top bracket 114 and the bottom bracket 116 may each be coupled to the chassis 112 of the video-conferencing device 104, such as with thumb screws 118. The downward lip 146 of the top bracket 114 may be positioned over and behind the elongated protrusion 121 of the cradle 110, as shown by dashed line 158 in FIGS. 4 and 5. The protrusion 152 may be positioned in the recess 154 as shown by dashed lines 160 in FIGS. 4 and 5, to align the securing hole 138 of the cradle 110 and the other hole 156 of the bottom bracket 116. The mounting thumb screw 122 may be passed through the other hole 156 and at least into the securing hole 138, as shown by dashed line 162. After the top bracket 114 and the bottom bracket 116 are coupled to the chassis 112, in some embodiments only a single fastener (e.g., the mounting thumb screw 122) may be used to securely and removably couple the video-conferencing device 104 to the cradle 110. The video-conferencing device 104 may be removed from the cradle with ease by releasing the mounting thumb screw 122, rotating a bottom of the video-conferencing device 104 outward to remove the protrusion 152 from within the recess 154, and lifting the video-conferencing device 104 to withdraw the elongated protrusion 121 of the cradle 110 from within the gap 148 defined between a surface of the top bracket 114 and the video-conferencing device 104.

Figure 6:
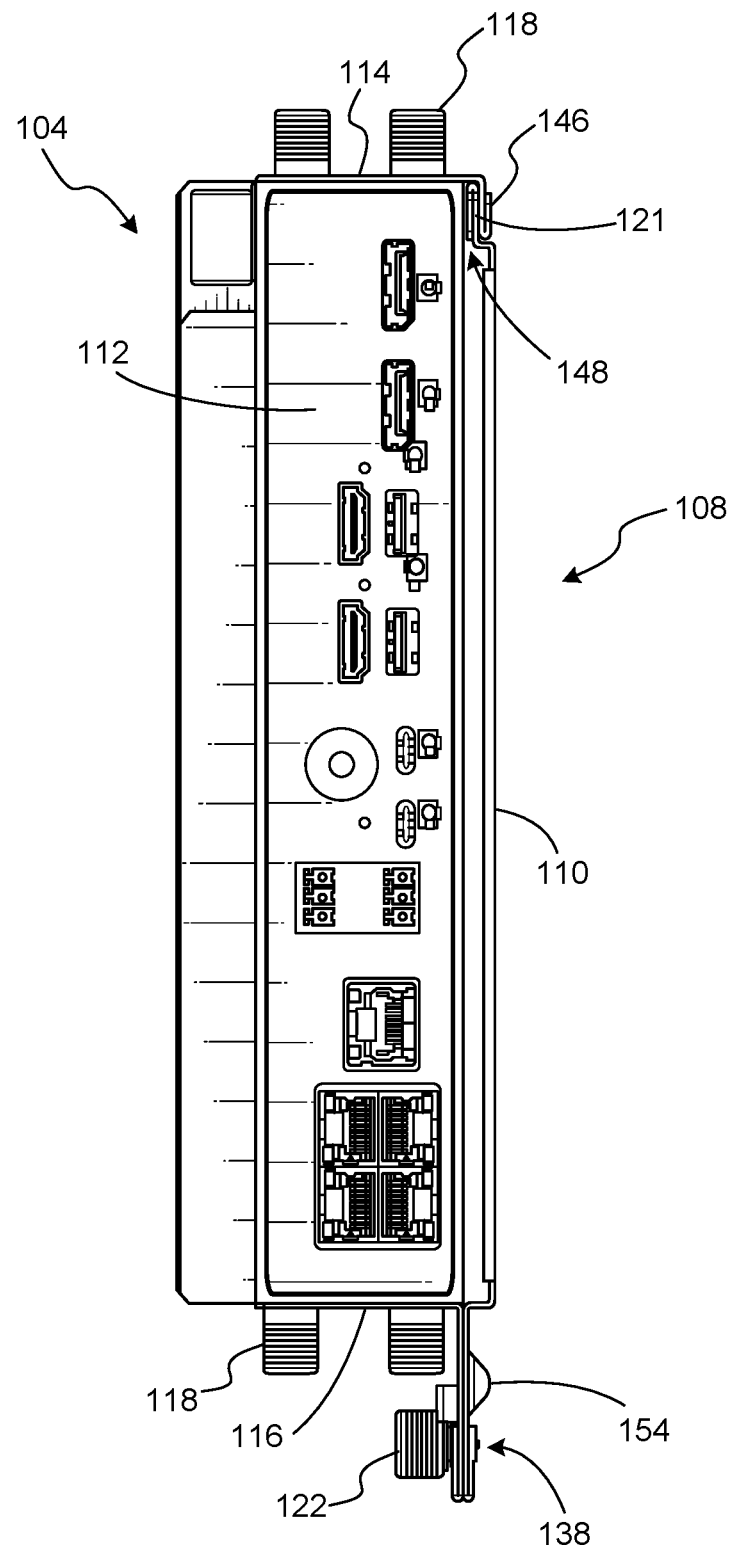
FIG. 6 is an assembled side view of the video-conferencing device and mounting system of FIG. 3.

FIG. 6 is a side view of the video-conferencing device 104 and the mounting system 108 after assembly is complete, as described above. As can be seen in FIG. 6, the elongated protrusion 121 of the cradle 110 may be positioned in the gap 148 defined by a surface of the downward lip 146 of the top bracket 114 and a back surface of the video-conferencing device. Thus, the top bracket 114 may be removably coupled to the cradle 110. In addition, the mounting thumb screw 122 may removably couple the bottom bracket 116 to the cradle 110 through the securing hole 138.

Figure 7:
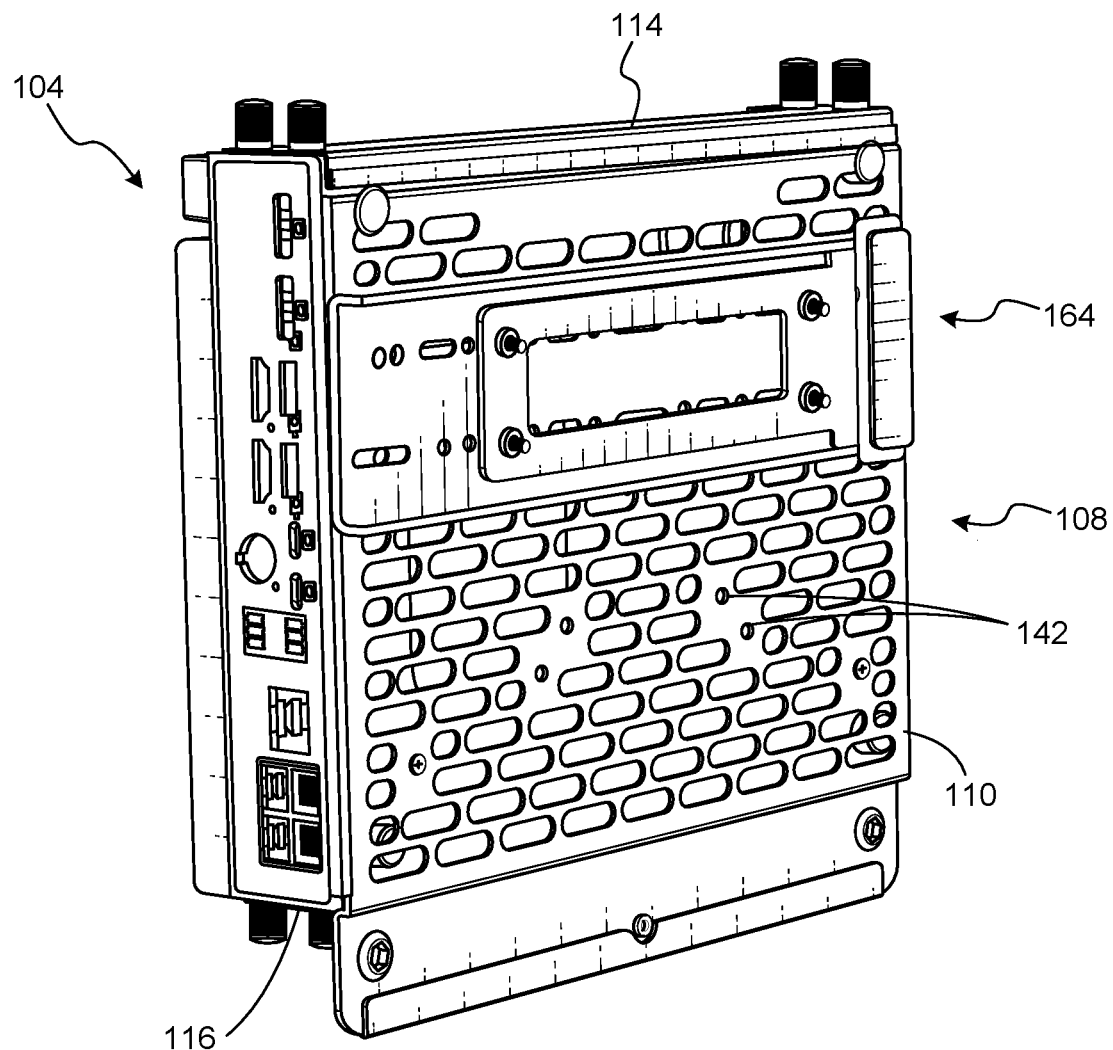
FIG. 7 is a rear perspective view of the video-conferencing device and mounting system of FIG. 3 attached to a horizontal wall mount.

FIG. 7 shows a rear perspective view of the assembled video-conferencing device 104 and mounting system 108 to illustrate an example mounting structure that may be used with the mounting system 108. As shown in FIG. 7, the cradle 110 may be secured to a wall mount 164, which may be mounted on a wall. As noted above, at least some of the mounting holes 142 in the cradle 110 may be configured and positioned for attachment to the wall mount 164. In use, the wall mount 164 may first be mounted to a wall, the cradle 110 may then be coupled to the wall mount 164, and the video-conferencing device 104, with the top bracket 114 and bottom bracket 116 coupled to the chassis of the video-conferencing device 104, may be removably coupled to the cradle 110 as described above.

Figure 8:
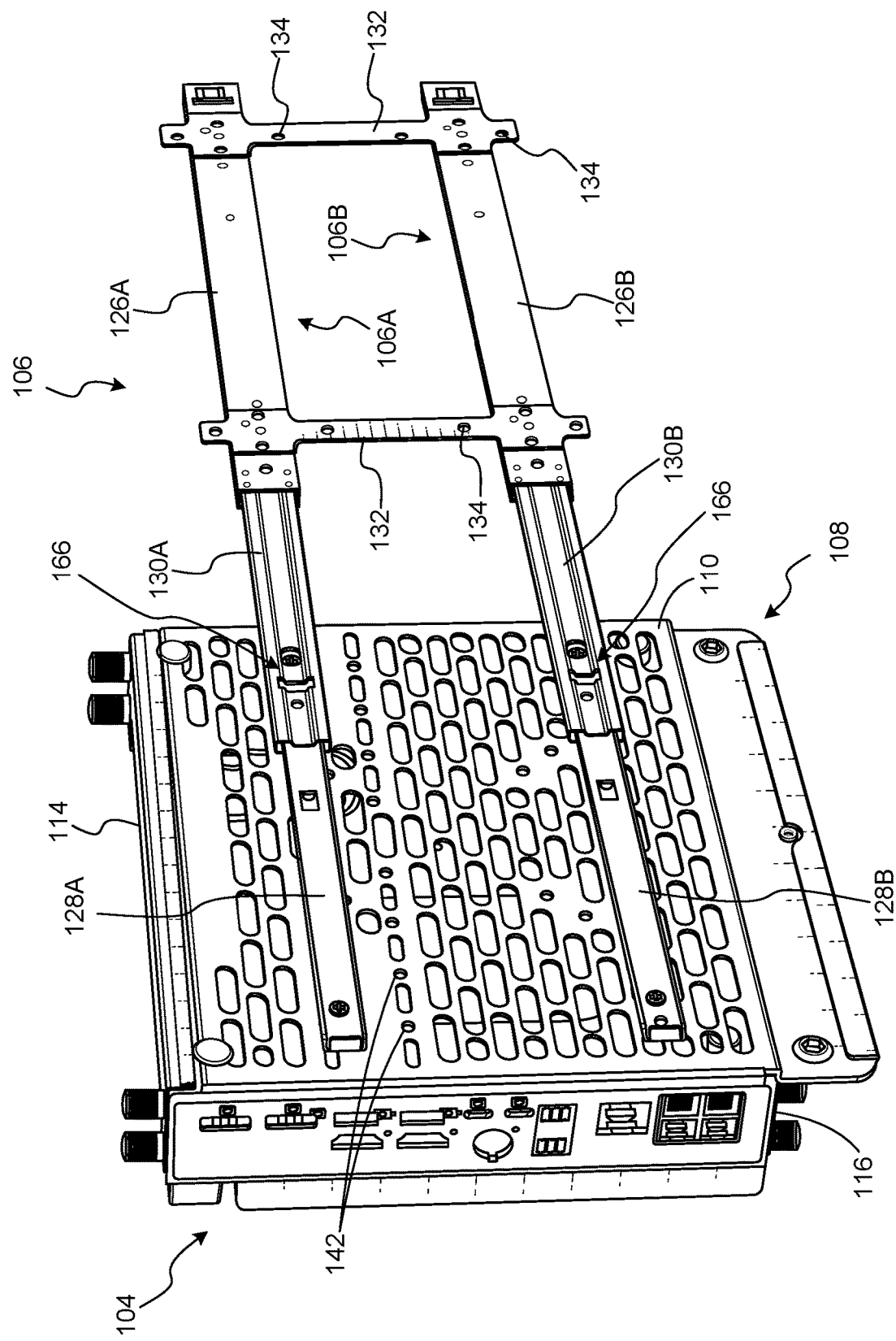
FIG. 8 is a rear perspective view of the video-conferencing device and mounting system of FIG. 3 attached to a sliding-rail mount.

FIG. 8 shows a rear perspective view of the assembled video-conferencing device 104 and mounting system 108 to illustrate another example mounting structure that may be used with the mounting system 108. As shown in FIG. 8, and as also described with reference to FIG. 2 above, the cradle 110 may be coupled to a rail assembly 106. In some embodiments, the rail assembly 106 may include the upper sliding rail 106A and the lower sliding rail 106B. The upper sliding rail 106A may include the upper base rail element 126A, the upper sliding rail element 128A, and the upper intermediate rail element 130A. Similarly, the lower sliding rail 106B may include the lower base rail element 126B, the lower sliding rail element 128B, and the lower intermediate rail element 130B. The sliding rail elements 128A, 128B may be coupled to the cradle 110 using at least some of the mounting holes 142 in the cradle 110.

The rail assembly 106 may also include one or more locking mechanisms 166 to maintain the rail assembly 106 in an extended, open position in the absence of a sufficient applied closing force. The locking mechanisms 166 may, in some embodiments, be pull-to-lock mechanisms. By way of example and not limitation, the locking mechanisms 166 may be configured to engage with the sliding rail elements 128A, 128B, with the intermediate rail elements 130A, 130B, and/or with the base rail elements 126A, 126B to maintain the rail assembly 106 in the open position. When a sufficient closing force is applied to the sliding rail elements 128A, 128B (e.g., by pushing or pulling on the video-conferencing device 104 toward the closed position), the locking mechanisms 166 may disengage to enable the rail assembly 106 to move toward the retracted, closed position.

Figure 9:
FIG. 9 is a flow diagram of an example method of mounting a video-conferencing device according to some embodiments of this disclosure.

FIG. 9 is a flow diagram that illustrates an example method 900 of mounting a video-conferencing device according to embodiments of the present disclosure. At operation 910, a top bracket may be coupled to a chassis of a video-conferencing device. Operation 910 may be performed in a variety of ways. For example, as discussed above, the top bracket may be secured to the chassis via thumb screws or other suitable fasteners. At operation 920, a bottom bracket may be coupled to the chassis in a similar manner. Example embodiments of top and bottom brackets and methods of coupling the brackets to the chassis of the video-conferencing device are described above.

At operation 930, the top bracket may be removably coupled to an upper portion of a cradle that is configured to support the video-conferencing device. Operation 930 may be performed in a variety of ways. For example, as described above with reference to FIGS. 4-6, a downward lip of the top bracket may be positioned over an elongated protrusion of the cradle, and the elongated protrusion may be positioned within a gap defined by a surface of the top bracket and the video-conferencing device.

At operation 940, the bottom bracket may be removably coupled to a lower portion of the cradle. Operation 940 may be performed in a variety of ways. For example, as described above, a first hole in the bottom bracket may be aligned with a second hole in the cradle, and a fastener (e.g., a thumb screw) may be positioned in the first hole and the second hole. Additional examples of removably coupling the bottom bracket to the cradle include the use of a wing nut or a twist lock fastener. In addition, at least one protrusion of the bottom bracket may be positioned at least partially within a corresponding recess(es) in the cradle. In some examples, the cradle may also be attached to a mounting structure, such as a wall, a VESA mount, a wall mount, a horizontal monitor screen mount, or a sliding-rail mount, for example.

Accordingly, disclosed are video-conferencing systems, mounting systems for video-conferencing devices, and methods that may exhibit certain improvements over conventional systems, devices, and methods. For example, mounting systems according to embodiments of the present disclosure may facilitate installation and removal of video-conferencing devices, including in tight spaces such as behind video-conferencing displays. With mounting systems according to the present disclosure, the video-conferencing device may be easily installed, may have sufficient air flow for cooling, may be securely supported when assembled, and may be easily removed (e.g., with the use of a single fastener, manually without requiring tools, etc.) for maintenance or replacement. In addition, embodiments of the present disclosure may be capable of mounting video-conferencing devices to a number of different standard or custom mounting structures.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A mounting system for a video-conferencing device, the mounting system comprising:
 a cradle configured to support a video-conferencing device behind a wall-mounted video display;
 a top bracket configured to couple to a chassis of the video-conferencing device and configured to removably couple to an upper portion the cradle; and
  a bottom bracket configured to couple to the chassis of the video-conferencing device and configured to removably couple to a lower portion of the cradle.

2. The mounting system of claim 1, wherein the cradle comprises an elongated protrusion and a surface of the top bracket at least partially defines a gap shaped and oriented to receive the elongated protrusion.

3. The mounting system of claim 2, wherein the elongated protrusion extends upward when the system is assembled.

4. The mounting system of claim 1, wherein the bottom bracket comprises a first hole and the cradle comprises a second hole located to align with the first hole when the system is assembled, wherein the system further comprises a fastener to secure the bottom bracket to the cradle via the first hole and the second hole.

5. The mounting system of claim 4, wherein the fastener comprises a thumb screw, a twist lock fastener, or a wing nut.

6. The mounting system of claim 1, wherein the bottom bracket comprises at least one recess and the cradle comprises at least one corresponding protrusion positioned to seat at least partially within the at least one recess when the system is assembled.

7. The mounting system of claim 1, wherein the cradle comprises a plurality of holes positioned for engagement with a plurality of different mounting structures.

8. The mounting system of claim 7, wherein the plurality of different mounting structures comprises at least two of:
 a wall;
 a Video Electronics Standards Association (VESA) mount;
 a wall mount;
 or
 a sliding-rail mount.

9. The mounting system of claim 7, wherein the each of the top bracket and the bottom bracket comprises at least one hole for coupling to the chassis of the video-conferencing device.

10. A video-conferencing system, comprising:
 a video-conferencing device comprising a chassis and at least video and audio outputs and video and audio inputs;
 a cradle configured to support the video-conferencing device behind a wall-mounted video display;
 a top bracket coupled to the chassis and configured to removably couple to an upper portion of the cradle; and
 a bottom bracket coupled to the chassis and configured to removably couple to a lower portion of the cradle.

11. The video-conferencing system of claim 10, wherein the top bracket and the bottom bracket are each coupled to the chassis via thumb screws, twist lock fasteners, or wing nuts.

12. The video-conferencing system of claim 10, wherein the chassis of the video-conferencing device comprises holes located for coupling the video-conferencing device to the top bracket and to the bottom bracket.

13. The video-conferencing system of claim 10, wherein the cradle comprises an elongated protrusion and the top bracket comprises a surface that at least partially defines a gap shaped and sized for receiving at least a portion of the elongated protrusion when the video-conferencing device is mounted to the cradle.

14. The video-conferencing system of claim 13, wherein the chassis of the video-conferencing device comprises a surface that also at least partially defines the gap.

15. The video-conferencing system of claim 10, wherein the bottom bracket comprises an attachment element and the cradle comprises a complementary engagement feature for removably coupling the bottom bracket to the cradle.

16. The video-conferencing system of claim 10, wherein each of the top bracket and the bottom bracket has an L-shaped cross section.

17. A method of mounting a video-conferencing device, comprising:

coupling a top bracket to a chassis of a video-conferencing device;
bottom bracket to the chassis of the video-conferencing device;
removably coupling the top bracket to an upper portion of a cradle that is configured to support the video-conferencing device;
removably coupling the bottom bracket to a lower portion of the cradle; and
positioning the video-conferencing device behind a wall-mounted video display.

18. The method of claim 17, wherein removably coupling the top bracket to the upper portion of the cradle comprises positioning an elongated protrusion of the cradle within a gap at least partially defined by a surface of the top bracket.

19. The method of claim 17, wherein removably coupling the bottom bracket to the lower portion of the cradle comprises at least one of:
   positioning at least one protrusion of the bottom bracket at least partially within at least one corresponding recess in the cradle; or
   securing the bottom bracket to the cradle with a thumb screw, a twist lock fastener, or a wing nut.

20. The method of claim 17, further comprising attaching the cradle to a mounting structure that is at least one of:
   a wall;
   a Video Electronics Standards Association (VESA) mount;
   a wall mount;
   or
   a sliding-rail mount.

\* \* \* \* \*